(12) United States Patent
Takami

(10) Patent No.: US 6,759,895 B2
(45) Date of Patent: Jul. 6, 2004

(54) DATA LATCH CIRCUIT HAVING ANTI-FUSE ELEMENTS

(75) Inventor: Shinya Takami, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/461,418

(22) Filed: Jun. 16, 2003

(65) Prior Publication Data

US 2003/0231534 A1 Dec. 18, 2003

(30) Foreign Application Priority Data

Jun. 14, 2002 (JP) ......................................... 2002-174381

(51) Int. Cl.$^7$ ............................................. H01N 37/76
(52) U.S. Cl. ........................ 327/525; 327/526; 327/524; 365/225.7; 326/37
(58) Field of Search ................................ 327/524, 526, 327/55, 57, 208, 210–215, 218, 219; 326/37, 38; 365/225.7, 96, 102, 149

(56) References Cited

U.S. PATENT DOCUMENTS 6,323,720 B1 * 11/2001 Kim et al. ................... 327/525
6,351,407 B1 * 2/2002 Candelier ................... 365/149

FOREIGN PATENT DOCUMENTS

| JP | 4-297063 A | 10/1992 |
|---|---|---|
| JP | 5-198757 A | 8/1993 |
| JP | 8-130250 A | 5/1996 |
| JP | 2000-503794 A | 3/2000 |
| JP | 2001-023390 A | 1/2001 |

* cited by examiner

Primary Examiner—Long Nguyen
(74) Attorney, Agent, or Firm—Sughrue Mion, PLLC

(57) ABSTRACT

A data latch circuit includes anti-fuse elements for storing remedy information therein as to replacement of defective memory cells by redundant memory cells. For programming the anti-fuse elements to a logic level "1" in a programming mode, control signals CTL1 and CTL2 are set at a low level and a high level, respectively, and programming control signals PGMA and PGMB are set at a high level and a low level, respectively. A voltage selection node Nvs delivers a programming voltage Vpp, lowering an output terminal RCB to effect dielectric breakdown of anti-fuse element 25, which assumes a low resistance. In a normal operation mode, programming voltages PUMA and PGMB are set at a low level and a high level, respectively, and both control signals CTL1 and CTL2 are set at a low level Voltage output node Nvs delivers the normal operating voltage, raising output terminal RC to a high level to thereby deliver the stored logic level "1".

24 Claims, 11 Drawing Sheets

DATA LATCH CIRCUIT HAVING ANTI-FUSE ELEMENTS

BACKGROUND OF THE INVENTION (a) Field of the Invention

The present invention relates to a data latch circuit having anti-fuse elements and, more particularly, to a data latch circuit having functions of programming anti-fuse elements with desired data and delivering the nonvolatile data stored in the anti-fuse elements.

(b) Description of the Related Art

In an LSI including a memory circuit, it is difficult to perfectly exclude defects in some of the memory cells during manufacturing the memory circuit. To remedy a product memory device including therein one or more defective memory cells, redundant memory cells are generally used in the memory device to replace the detective memory cells by the redundant memory cells.

The remedy information as to the remedy of the defective memory cells by the redundant memory cells is stored in nonvolatile memory elements, such as EPROM elements which are electrically programmable, fuse elements which are fused by a critical current to assume an electrically open state, and anti-fuse elements (or non-fuse elements) which are applied with a critical voltage to be short-circuited due to the dielectric breakdown thereof.

Among other nonvolatile memory elements for storing the remedy information, the anti-fuse elements are generally preferable especially in a mixed LSI including together a logic macro block and a large-capacity memory macro block, such as SRAM and DRAM. The anti-fuse elements are superior to the EPROM elements which require a large number of fabrication steps and thus the increased costs thereof. The anti-fuse elements are superior to the fuse elements which prohibit metallic interconnections from being disposed overlying the fuse elements in view of the heat generated in the fuse elements during the fusing operation thereof and thus require an increased occupied area.

The anti-fuse elements have an advantage in that the current passing through the anti-fuse elements during the dielectric breakdown thereof is considerably smaller than the current used for fusing the fuse elements, especially in the case of capacitive anti-fuse elements, and thus the heat generated by the dielectric breakdown can be neglected for the safe operation.

However, there is a problem in the conventional anti-fuse elements that the anti-fuse elements have an average resistance around several hundreds of ohms after the dielectric breakdown, wherein some anti-fuse elements may have several tens of kilo-ohms at the maximum, although this is a relatively rare case. In the case of several tens of kilo-ohms for the resistance of the anti-fuse elements, the judgement whether the anti-fuse elements are conductive or non-conductive is difficult and must be performed by using a detector having a higher sensitivity.

JP domestic publication 2000-503794 for PCT describes a data latch circuit including a detector having an improved sensitivity for the data stored in the anti-fuse elements. FIG. 11 shows the data latch circuit described in the publication, wherein anti-fuse elements to be detected for the resistances thereof are implemented as capacitive anti-fuse elements 77 and 78.

A power supply voltage is applied through terminal VDD to the sources of pMOSFETs 71 and 72, a programming voltage is applied through terminal VPRG to the sources of pMOSFETs 81 and 82, first and second bypass voltages PB are applied to the gates of pMOSFETs 73 and 74, respectively.

To program the capacitive anti-fuse elements 77 and 78 to a logic level "1", capacitive anti-fuse element 77 is subjected to dielectric breakdown of the gate insulation film. More specifically, for the programming, nMOSFETs 75, 76, 79, 80 and 84 are turned OFF, pMOSFET 81 and nMOSFET 83v are turned ON, and pMOSFET 82 is turned OFF. Due to the potential difference, which is equal to the programming voltage, between both the plates (electrodes) of capacitive element 77, capacitive element 77 having a dielectric withstand voltage lower than the programming voltage is subjected to a dielectric breakdown, whereby the resistance of capacitive element 77 is reduced. On the other hand, since both the plates of capacitive element 78 have no potential difference therebetween, capacitive element 78 maintains a higher insulating resistance.

To read the data from the capacitive elements 77 and 78 in the data latch circuit, nMOSFETs 79 and 80 are turned ON, nMOSFETs 75 and 76 are applied with the bypass voltages PB, and pMOSFETs 81 and 82 and nMOSFETs 83 and 84 are turned OFF. The cross connection between the drain of each of pMOSFETs 71 and 72 and the gate of the other of pMOSFETs 71 and 72 allows a difference between the currents passing through the capacitive anti-fuse elements 77 and 78 to be amplified and delivered as an amplified difference signal from the detector. In this case, since the current passing through capacitive element 77 subjected to the dielectric breakdown is larger than the current passing through capacitive element 78 not subjected to dielectric breakdown, output terminal RCB assumes a low level whereas output terminal RC assumes a high level, thereby delivering a logic level "1" from the data latch circuit.

The conventional detector as described above can detect the stored data even from the capacitive anti-fuse element having a resistance as high as several tens of kilo-ohms after the dielectric breakdown. However, the above publication is silent to the concrete structure of the capacitive anti-fuse elements 77 and 78 except that the first-conductivity-type plate and second-conductivity-type plate are provided in the capacitive elements, and that the power supply voltage applied through terminals VDD is applied to these plates via nMOSFETs 75 and 76 effecting voltage drops.

It is considered from the description that each capacitive element has a thin dielectric film between the plates thereof, and that the thin dielectric film may be broken by direct application of the supply voltage. Since it is unclear whether or not the programming voltage is higher than the supply voltage, it is also unclear whether the pMOSFETs such as 81 and 82 applied with the programming voltage has a withstand voltage higher than the withstand voltage of pMOSFETs 71 and 72 applied with the supply voltage, or has a withstand voltage equal to the withstand voltage of pMOSFETs 71 and 72.

In short, although the above publication describes the structure of the detector for detecting the data stored in the data latch circuit, the publication does not show the concrete structures of the anti-fuse elements and the transistor elements constituting the programming circuit and thus the concrete structure of the data latch circuit as a whole.

In addition, the detector described in the publication has a large occupied area because of a large number (12) of MOSFETs including eight high-withstand-voltage MOS- FETs 81, 82, 75, 76, 79, 80, 83 and 84 including gates having a larger thickness, assuming that the programming voltage is higher than the supply voltage.

SUMMARY OF THE INVENTION

In view of the above, it is an object of the present invention to provide a data latch circuit including anti-fuse elements, which is capable of being manufactured with a reduced number of transistor elements and thus with reduced costs and reduced occupied area.

The present invention provides a data latch circuit including: a voltage selection block for selecting one of a normal operating voltage supplied from a first power source and a programming voltage supplied from a second power source, to output a selected voltage through a voltage selection node; a first first-conductivity-type MOSFET including a source and a backgate connected together to the voltage selection node, a gate connected to a first output terminal, and a drain connected to a second output terminal; a second first-conductivity-type MOSFET including a source and a backgate connected together to the voltage selection node, a gate connected to the second output terminal, and a drain connected to the first output terminal; a first anti-fuse element including a first electrode connected to the first output terminal, a second electrode connected to a third power source, and an insulating film sandwiched between the first electrode and the second electrode and having a first withstand voltage lower than the programming voltage; a second anti-fuse element including a first electrode connected to the second output terminal, a second electrode connected to the third power source, and an insulating film sandwiched between the first electrode and the second electrode and having the first withstand voltage; a first second-conductivity-type MOSFET including a drain connected to the second output terminal, a gate for receiving a first control signal, and a source and a backgate connected together to the third power source; a second second-conductivity-type MOSFET including a drain connected to the first output terminal, a gate receiving a second control signal, and a source and backgate connected the third power source, wherein each of the first and second first-conductivity-type MOSFETs and the first and second second-conductivity-type MOSFETs includes a gate insulation film having a second withstand voltage higher than the programming voltage.

The present invention also provides a semiconductor device including: an internal logic circuit operating at a first voltage supplied from a first power source, the internal logic circuit including internal MOSFETs each having a gate insulation film having a first withstand voltage; an I/O circuit block operating at a second voltage higher than the first voltage and including I/O MOSFETs for inputting/outputting a signal for the internal logic circuit, at least one of the I/O MOSFETs including a gate insulation film having a second withstand voltage higher than the first withstand voltage; and a memory macro block including a remedy circuit, a plurality of ordinary memory mats and at least one redundant memory mat, each of the ordinary memory mats and the redundant memory mat including a memory cell array, a column selection section and a read/write section, the remedy circuit including a plurality of data latch circuits each for storing remedy information and having functions of inactivating the read/write section of a corresponding one of the ordinary memory mats and activating the read/write section of the redundant memory mat, each of the data latch circuits including: a voltage selection block for selecting one of the first voltage and the second voltage to output a selected voltage through a voltage selection node; a first first-conductivity-type MOSFET including a source and a backgate connected together to the voltage selection node, a gate connected to a first output terminal, and a drain connected to a second output terminal; a second first-conductivity-type MOSFET including a source and a backgate connected together to the voltage selection node, a gate connected to the second output terminal, and a drain connected to the first output terminal; a first anti-fuse element including a first electrode connected to the first output terminal, a second electrode connected to a third power source, and an insulating film sandwiched between the first electrode and the second electrode and having a first withstand voltage lower than the programming voltage; a second anti-fuse element including a first electrode connected to the second output terminal, a second electrode connected to the third power source, and an insulating film sandwiched between the first electrode and the second electrode and having the first withstand voltage; a first second-conductivity-type MOSFET including a drain connected to the second output terminal, a gate receiving a first control signal, and a source and a backgate connected together to the third power source; a second second-conductivity-type MOSFET including a drain connected to the first output terminal, a gate receiving a second control signal, and a source and backgate connected the third power source, wherein each of the first and second first-conductivity-type MOSFETs and the first and second second-conductivity-type MOSFETs includes a gate insulation film having a second withstand voltage higher than the programming voltage.

In accordance with the data latch circuit and the semiconductor device of the present invention, the data latch circuit including the anti-fuse elements has a higher sensitivity for detecting the programmed data, and can be manufactured with a reduced number of transistor elements, a reduced number of high-withstand-voltage MOSFETs and thus with a reduced occupied area. The anti-fuse elements and transistor elements constituting the data latch circuit may be fabricated by a common process for forming MOSFETs in an internal logic circuit and I/O circuit block.

The above and other objects, features and advantages of the present invention will be more apparent from the following description, referring to the accompanying drawings.

PREFERRED EMBODIMENTS OF THE INVENTION

Figure 1:
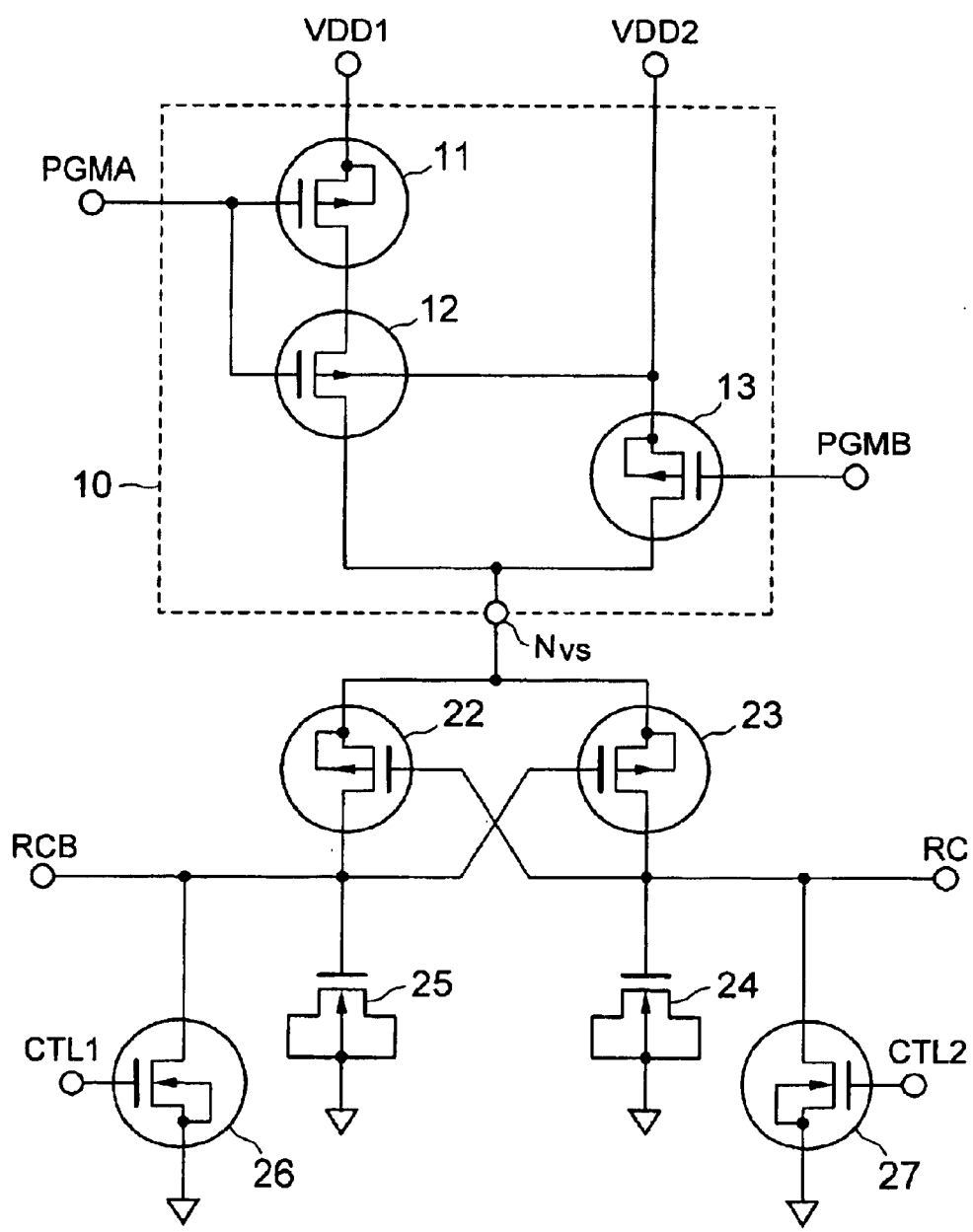
FIG. 1 is a circuit diagram of a data latch circuit according to a first embodiment of the present invention.

Now, the present invention is more specifically described with reference to accompanying drawings, wherein similar constituent elements are designated by similar reference numerals.

Referring to FIG. 1, a data latch circuit according to a first embodiment of the present invention includes a voltage selection block 10, pMOSFETs 22 and 23 constituting a latching block, nMOSFETs 26 and 27 for setting programming data, and nMOSFETs 24 and 25 constituting capacitive anti-fuse elements to be programmed with a logic level "1" or "0". The logic level "1" to be stored in the data latch circuit effects dielectric breakdown of the gate insulation film of anti-fuse element 25, whereas logic level "0" effects dielectric breakdown of the gate insulation film of anti-fuse element 24.

The data latch circuit of FIG. 1 reads and latches the logic level stored in the anti-fuse elements 24 and 25 to deliver the latched logic level through output terminal RC and inverted latched logic level through output terminal RCB. The gate insulation films of nMOSFETs 24 and 25 have a first thickness, whereas the gate insulation films of pMOSFETs 22 and 23 and nMOSFETs 26 and 27 have a second thickness larger than the first thickness and thus have a higher withstand voltage.

The voltage selection block 10 is connected to a first power source VDD1 providing a normal operating voltage Vop, and a second power source VDD2 providing a programming voltage Vpp. The voltage selection block 10 selects one of the normal operating voltage Vop and programming voltage Vpp based on a pair of programming control signals PGMA and PGMB, thereby delivering a selected voltage VS through a voltage selection node Nvs thereof.

The pMOSFET 22 has a source and a backgate connected together to voltage selection node Nvs, a gate connected to output terminal RC, and a drain connected to output terminal RCB. The pMOSFET 23 has a source and a backgate connected together to voltage selection node Nvs, a gate connected to output terminal RCB and a drain connected to output terminal RC.

The nMOSFET 24 constituting the anti-fuse element has a gate connected to output terminal RC, and source, drain and backgate connected together to the ground, i.e., a third power source. The nMOSFET 25 has a gate connected to output terminal RCB, and source, drain and backgate connected together to the ground.

The nMOSFET 26 has a drain connected to output terminal RCB, a gate receiving a control signal CTL1, and source and backgate connected together to the ground. The nMOSFET 27 has a drain connected to output terminal RC, a gate receiving a control signal CTL2, and source and backgate connected together to the ground.

The voltage selection block 10 includes higher-withstand-voltage pMOSFETs 11, 12 and 13 including gate insulation films having the second thickness. The pMOSFET 11 includes source and backgate connected together to the first power source VDD1, and a gate receiving programming control signal PGMA. The pMOSFET 12 includes a source connected to the drain of pMOSFET 11, a gate receiving programming control signal PGMA, a drain connected to voltage selection node Nvs, and a backgate connected to the second power source VDD2. The pMOSFET 13 includes source and backgate connected together to the second power source VDD2, a gate receiving programming control signal PGMB, and a drain connected to voltage selection node Nvs.

Figure 2:
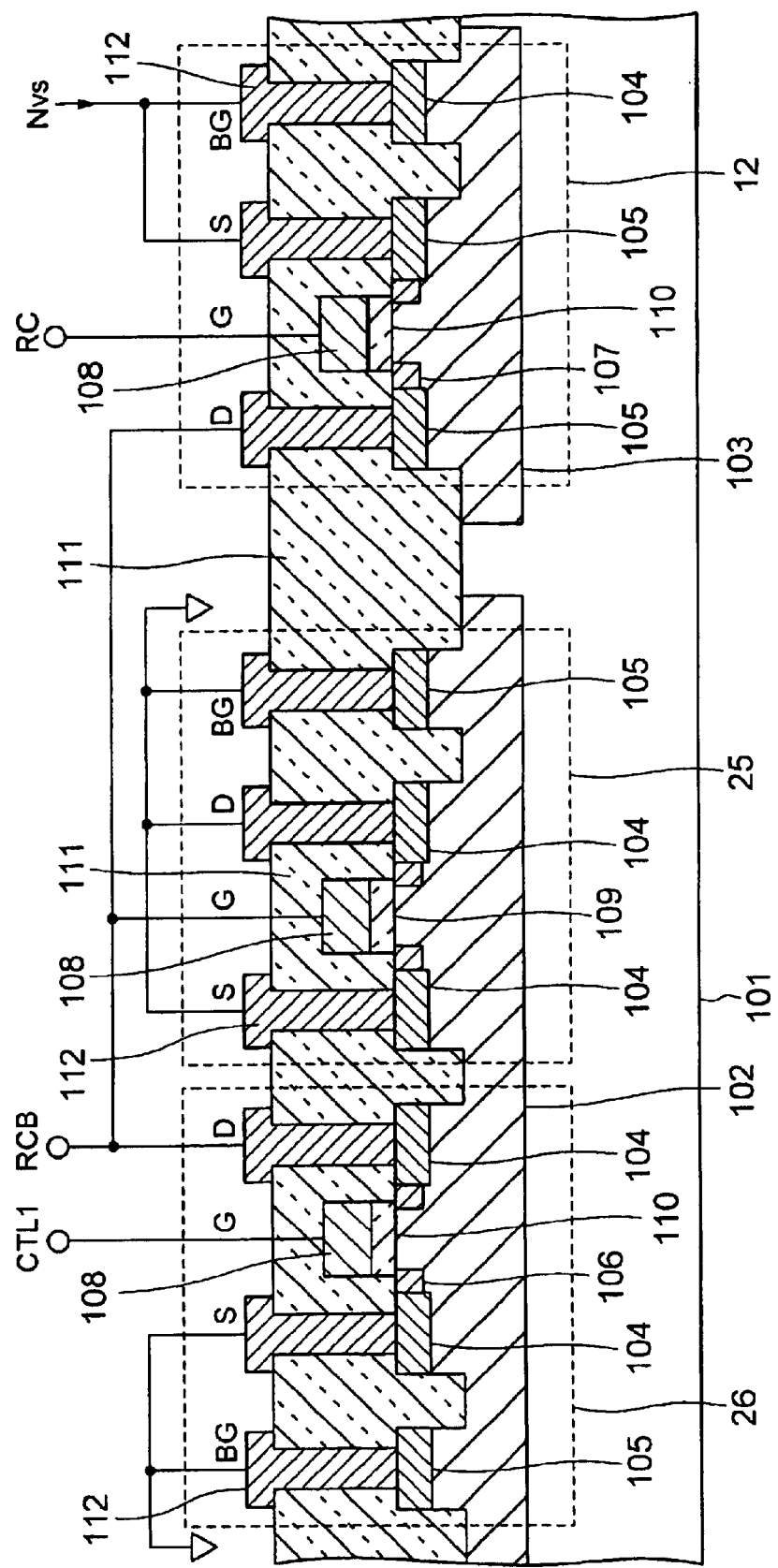
FIG. 2 is a schematic sectional view of MOSFETs implementing the data latch circuit of FIG. 1.

Referring to FIG. 2, there are schematically shown sectional views of pMOSFET 12 and nMOSFETs 25 and 26 consecutively from the right toward the left in the drawing. The gate insulation film 109 of pMOSFET 25 has the first thickness, whereas the gate insulation films 110 of pMOSFET 12 and nMOSFET 26 have the second thickness larger than the first thickness. The pMOSFET 12 has source/drain diffused regions 105 formed in an n-well 103, which is formed on a p-type semiconductor substrate 101, and nMOSFETs 25 and 26 have source/drain diffused regions 104 formed in a p-well 102, which is formed on the p-type substrate 101. The source/drain diffused regions 105 and 104 are associated with respective lightly-doped-drain (LDD) regions 107 and 106. The gates 108 of MOSFETs 12, 25 and 26 are made of polysilicon, for example, and connected to aluminum interconnects 112 via contact plugs. Element isolation film 111 separates pMOSFET 12 from nMOSFETs 25 and 26. The backgates of nMOSFETs 25 and 26 are connected together via the common p-well 102.

The gate insulation films having different thicknesses can be fabricated by the technique described in Patent Publications JP-A-8-130250 and -4-297063, for example. The LDD structure of MOSFETs is used for raising the withstand voltage of the drain regions. However, this LDD structure may be replaced by an off-set drain structure such as described in JP-A-4-297063, a double-diffusion structure including a lightly doped region and a heavily doped region, as described in JP-A-8-130250, or a lightly-doped-drain structure such as described in JP-A-5-198757.

Figure 3A:
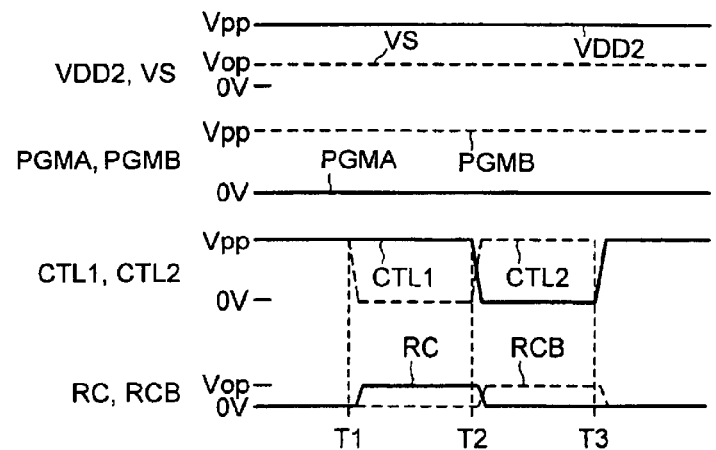
FIGS. 3A to 3C are timing charts showing operations of the data latch circuit of FIG. 1.
Figure 3B:
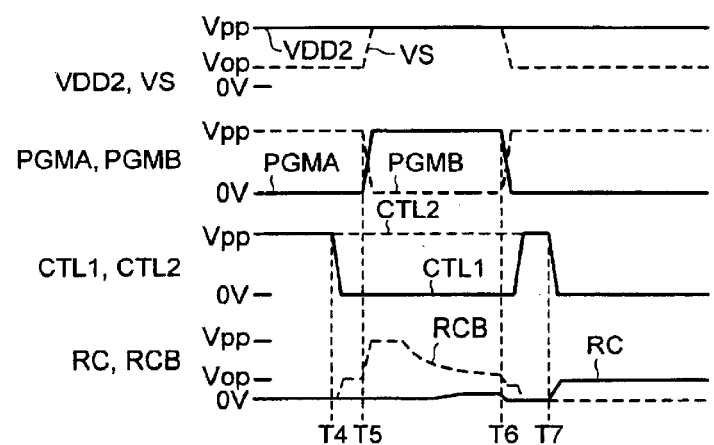
Figure 3C:
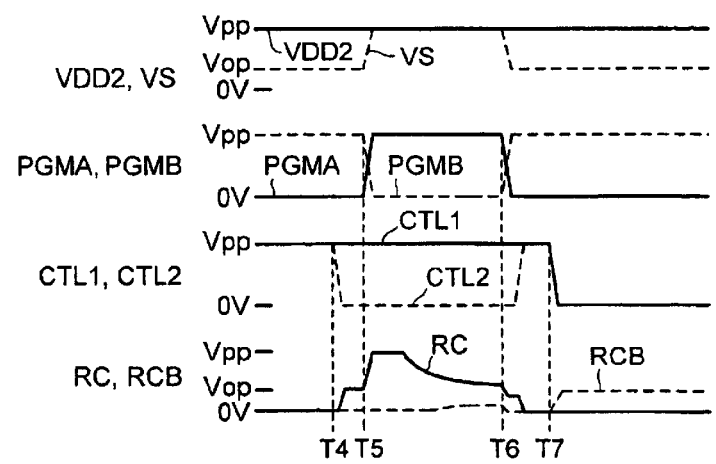

In operation, the data latch circuit has three modes including a test mode, a programming mode and a normal operation mode. FIGS. 3A to 3C show the test mode, the programming mode for programming the anti-fuse elements to a logic level "1" and transition to the normal operation mode, and the programming mode for programming the anti-fuse elements to a logic level "0" and transition to the normal operation mode, respectively. The first power source VDD1 supplies the normal operating voltage Vop, whereas the second power source VDD2 supplies the programming voltage Vpp shown in these figures.

The programming voltage Vpp is set higher than the withstand voltage of the anti-fuse nMOSFETs 24 and 25 including the gate insulation films having the first thickness and lower than the withstand voltage of MOSFETs 11, 12, 13, 22, 23, 26 and 27 including the gate insulation films having the second thickness. The normal operating voltage Vop is lower than the withstand voltage of the anti-fuse nMOSFETs 24 and 25 including the gate insulation films having the first thickness.

Referring to FIG. 3A, it is examined in the test mode whether or not the anti-fuse nMOSFETs 24 and 25 reside in the state for allowing a programming operation thereto. More specifically, programming control signal PGMA assumes a low level, i.e., activating level for pMOSFETs 11 and 12 in the test mode, whereas programming control signal PGMB assumes a high level, i.e., inactivating level for pMOSFET 13 in the test mode. Thus, pMOSFETs 11 and 12 are ON and pMOSFET 13 is OFF in the test mode, whereby the voltage selection node Nvs assumes the normal operating voltage Vop as a selected voltage VS. It is determined that the ON-resistance of pMOSFETs 22 and 23 is considerably higher than the ON-resistance of nMOSFETs 26 and 27. Prior to time instant T1, both control signals CTL1 and CTL2 assume a high level, which allows output terminals RCB and RC to assume a low level, whereby the data latch circuit is in a halt state.

The data latch circuit enters a test mode at time instant T1, and examines anti-fuse nMOSFET 24 between time instants T1 and T2. Control signal CTL2 assumes a low level at T1, allowing output terminal RC to assume a high level provided that nMOSFET 24 is in the state of allowing a programming operation. On the other hand, if nMOSFET 24 has a defect of short-circuit failure in the gate insulation film thereof, the resistance between the gate and backgate of nMOSFET 24 is lower than the ON-resistance of pMOSFET 13, whereby both output terminals RC and RCB assume a low level.

Similarly, between time instants T2 and T3, anti-fuse nMOSFET 25 is examined. Control signals CTL1 and CTL2 assume a low level and a high level, respectively, at time instant T2, output terminal RCB assumes a high level provided that nMOSFET 25 is in the state of allowing a programming operation. On the other hand, if nMOSFET 25 has a defect of short-circuit failure in the gate insulation film thereof, the resistance between the gate and backgate of nMOSFET 25 is lower than the ON-resistance of pMOSFET 12, whereby both output terminals RC and RCB assume a low level.

As described above, the data latch circuit of FIG. 1 has a function for examining whether or not anti-fuse nMOSFETs are in the state of allowing a programming operation.

Referring to FIG. 3B, programming the anti-fuse nMOSFETs to a logic level "1" is performed between time instants T4 and T6. The signal levels delivered prior to T4 are similar to those delivered after time instant T3 shown in FIG. 3A.

Control signal CTL1 is first lowered to raise the level of output terminal RCB. That is, control signals are selected so that output terminal RC assumes a logic level opposite to the logic level to be programmed. In this stage, the potential of output terminal RCB is equal to the normal operating voltage Vop applied from the first power source VDD1.

At next time instant T5, programming control signals PGMA and PGMB are allowed to assume a high level and a low level, respectively, whereby the data latch circuit enters a programming mode. In the voltage selection block 10, pMOSFETs 11 and 12 are inactivated by programming control signal PGMA to turn OFF and pMOSFET 13 is activated by programming control voltage PGMB to turn ON, whereby voltage selection node Nvs selects the programming voltage Vpp applied from the second power source VDD2 as the selected voltage VS. Since output terminal RC assumes a low level and thus pMOSFET 25 is ON, the programming voltage Vpp is applied to the gate of nMOSFET 25, whereby the gate insulation film of nMOSFET 25 is subjected to dielectric breakdown for programming.

It was confirmed by our experiments that the gate insulation film implemented by a silicon oxide film is surely broken in the programming process by applying thereto an electric field of around 2.2 GV/m, and that the gate insulation film is never broken by applying thereto a continued electric field of around 0.7 GV/m for a long time. Accordingly, the normal operating voltage Vop, the programming voltage Vpp, and the thicknesses of the gate insulation films are determined to satisfy the above conditions. Application of a voltage above the withstand voltage of the gate insulation film reduces the insulating resistance across the gate insulation film from 100MΩ prior to application down to as low as an average of several hundreds of ohms.

At time instant T6, programming control signals PGMA and PGMB assume a low level and a high level, respectively, whereby pMOSFETs 11 and 12 are turned ON and pMOSFET 13 is turned OFF in the voltage selection block 10. Voltage selection node Nvs delivers therethrough the normal operating voltage Vop as a selected voltage VS, whereby the programming mode is finished. After both control signals CTL1 and CTL2 assume a high level, both output terminals RC and RCB assume a low level to halt the output operation of the data latch circuit.

After time instant T7, both control signals CTL1 and CTL2 assume a low level thereby allowing the data latch circuit to operate in a normal operation mode. In the normal operation mode, programming control signals PGMA and PGMB assume a high level and a low level, respectively, whereby voltage selection node Nvs selects the normal operating voltage Vop as a selected voltage VS. The potential of output terminal RCB falls due to the current path being formed between the gate electrode and the source/drain or backgate of nMOSFET 25 by the dielectric breakdown of the gate insulation film thereof by programming with a logic level "1". This lowers the gate potential of pMOSFET 23 to raise the potential of output terminal RC. Thus, programming nMOSFETs 25 and 26 to a logic level "1" allows output terminals RC and RCB to assume a high level and a low level, respectively, in the normal operation mode.

The data latch circuit of FIG. 1 latches the difference between the current of the anti-fuse element having a gate insulation film subjected to the dielectric breakdown and the current of the anti-fuse element having a gate insulation film not subjected to the dielectric breakdown. This provides a higher sensitivity for the detection of the programmed level. It is to be noted that programmed level can be detected even in the case wherein nMOSFET subjected to dielectric breakdown of the gate insulation film has a resistance of around a hundred kilo-ohms.

Referring to FIG. 3C, programming the anti-fuse nMOSFETs to a logic level "0" is performed between the time instants T4 and T6. The signal levels delivered prior to T4 are similar to those delivered after time instant T3 shown in FIG. 3A.

At time instant T4, control signal CTL2 is allowed to assume a low level to raise the potential of terminal RC to a high level, i.e., opposite to a programming logic level.

At time instant T5, programming control signals PGMA and PGMB assume a high level and a low level, respectively, to allow the data latch circuit to enter a programming mode, Voltage selection node Nvs delivers therethrough the programming voltage Vpp as a selected voltage VS. The low level of output terminal RCB turns on pMOSFET 23 and thus applies the programming voltage Vpp to the gate of nMOSFET 24, whereby nMOSFET is subjected to dielectric breakdown of the gate insulation film thereof for programming.

At time instant T6, programming control signals PGMA and PGMB assume a low level and a high level, respectively, whereby voltage selection node Nvs delivers the normal operating voltage Vop as a selected voltage VS, whereby the programming mode is finished.

At time instant T7, both control signals CTL1 and CTL2 assume a low level, whereby the data latch circuit enters a normal operation mode. The potential of output terminal RC falls due to the current path formed between the gate and source/drain or backgate of nMOSFET 24 by the dielectric breakdown of the gate insulation film of nMOSFET 24. This lowers the gate potential of pMOSFET 22 to raise the potential of output terminal RCB. Thus, output terminals RC and RCB assume a low level and a high level, respectively, whereby the data latch circuit delivers a logic level "0".

As described above with reference to FIGS. 3B and 3C, the data latch circuit enters a programming mode after programming control signals PGMA and PGMB assume a high level and a low level, respectively, whereas the data latch circuit exits the programming mode after programming control signals PGMA and PGMB assume a low level and a high level, respectively. A modification therefrom may be employed, wherein a programming mode switching signal switches the programming mode, while allowing the duration of the high level of programming control signal PGMA to control the programming time length, for example.

In the above embodiment of the present invention, the is conductivity types of MOSFETs may be reversed while reversing the polarities of the power sources, although the conductivity types described in the above embodiment are superior due to the reduced occupied area by employing the n-conductivity type for the MOSFETs 26 and 27.

Figure 11:
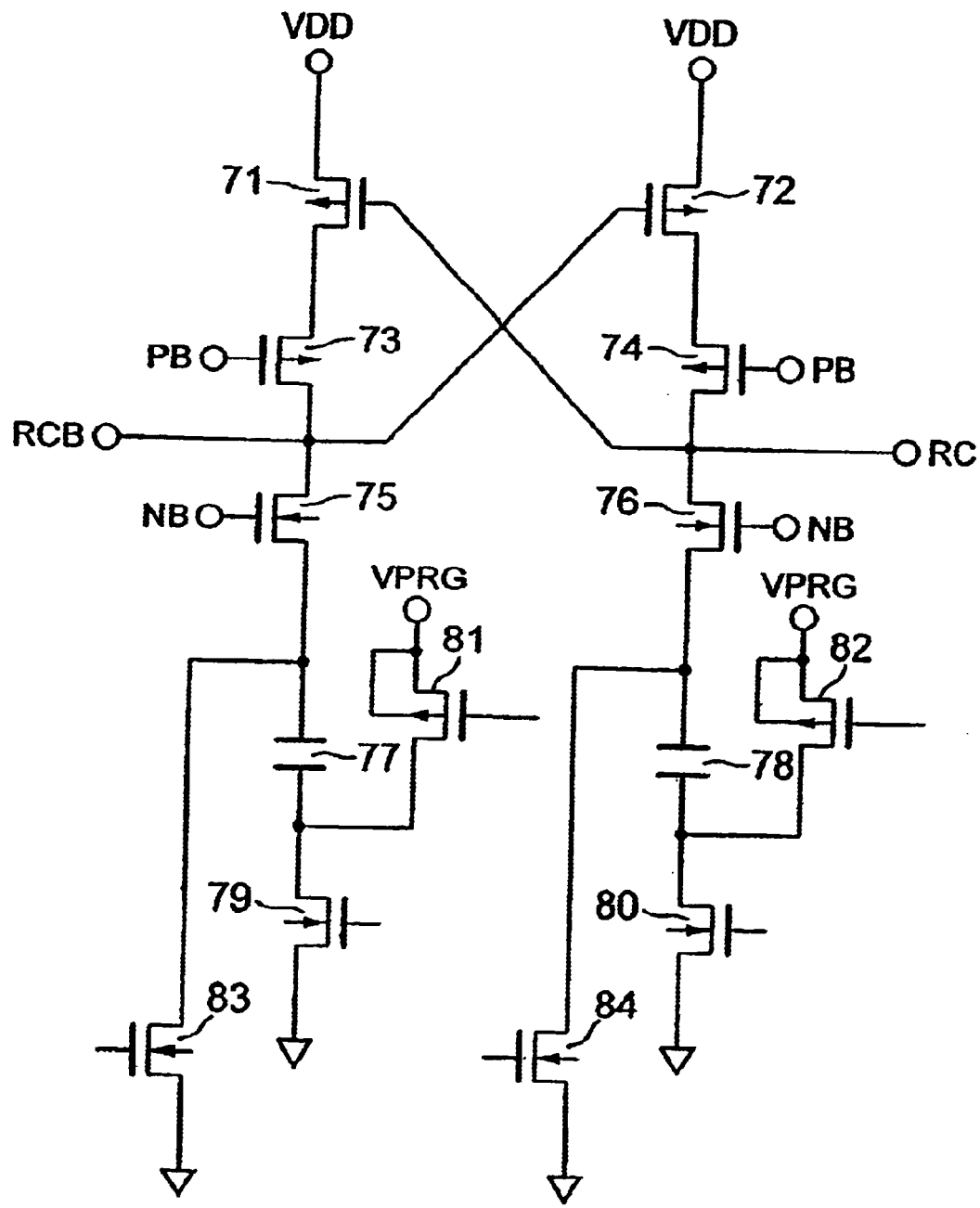
FIG. 11 is a circuit diagram of a conventional data latch circuit using anti-fuse elements.

The above embodiment has an advantage in that MOSFETs are used as anti-fuse elements to obviate the dedicated fabrication steps for the anti-fuse elements. In addition, the above embodiment uses nine MOSFETs, which is less than the number (twelve) of MOSFETs shown in FIG. 11. Further, the number of high-withstand-voltage MOSFETs is reduced to seven in the present embodiment, whereby the occupied area of the data latch circuit can-be reduced.

Figure 4:
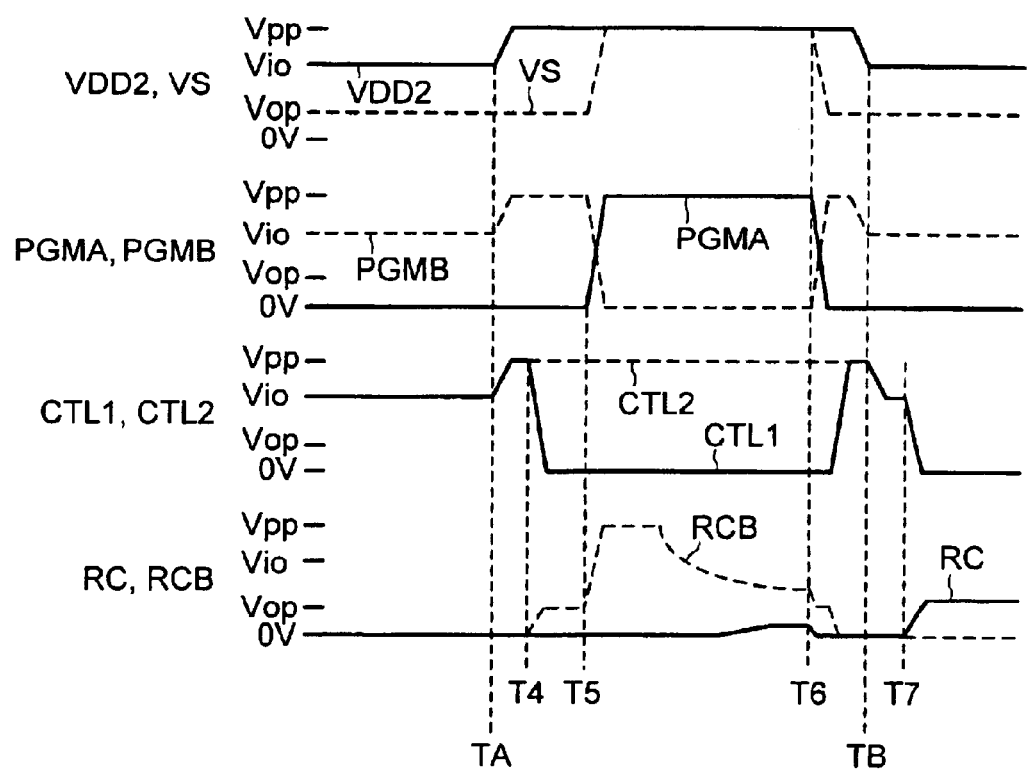
FIG. 4 is a timing chart showing operation of a data latch circuit according to a second embodiment of the present invention.

Referring to FIG. 4, there is shown a flowchart of operation of a data latch circuit according to a second embodiment of the present invention. The second embodiment is such that different voltages are applied from the second power source for the normal operation mode and the programming mode. In this embodiment, the second power source VDD2 shifts the voltage from I/O-circuit voltage Vio used for operating I/O blocks to the programming voltage Vpp after the data latch circuit enters a programming mode, and lowers the voltage from the programming voltage Vpp to the I/O-circuit voltage Vio after the data latch circuit exits the programming mode.

By changing the voltage of the second power source VDD2 between the programming mode and the other mode, an optimum programming voltage for the anti-fuse MOSFETs can be employed in the case where it is necessary to use a programming voltage higher than the I/O-circuit voltage Vio. The term "I/O-circuit voltage Vio" as used herein will be detailed later in this text with reference to FIG. 8.

The second power source has a voltage equal to Vio prior to time instant TA, and rises up to the programming voltage Vpp after entering the programming mode at time instant TA. The rise of voltage of the second power source VDD2 allows the high levels of the programming control signal PGMB and control signals CTL1 and CTL2 to rise up to the programming voltage Vpp.

To program the data latch circuit with a logic level "1", control signal CTL1 is lowered to a low level at time instant T4 thereby raising the potential of output terminal RC to a high level, i.e., a logic level opposite to the programming logic level.

At time instant T5. similarly to the case of FIG. 3B, programming control signals PGMA and PGMB assume a high level and a low level, respectively, whereby voltage selection node Nvs delivers therethrough the programming voltage Vpp as a selected voltage VS. The low level of output terminal RC turns ON pMOSFET 22, which allows nMOSFET 25 to be applied with the programming voltage Vpp for dielectric breakdown of the gate insulation film.

At time instant T6, programming control signals PGMA and PGMB assume a low level and a high level, respectively, whereby voltage selection node Nvs delivers therethrough the normal operating voltage Vop as a selected voltage VS, followed by falling of the second power source voltage VDD2 down to I/O-circuit voltage Vio to allow the data latch circuit to exit the programming mode.

Similarly to the case of FIG. 3B, at time instant T7, both control signals CTL1 and CTL2 assume a low level, whereby the data latch circuit enters a normal operation mode. The output voltage at output terminal RCB falls due to the current path being formed between the gate and source/drain or backgate of nMOSFET 25 by the dielectric breakdown of the gate insulation film. This reduces the gate potential of pMOSFET 23, thereby raising the output voltage at output terminal RC. Thus, data latch circuit programmed to a logic level "1" outputs a logic level "1" by delivering a high level through output terminal RC and a low level through output terminal RCB, as illustrated in FIG. 4.

The data latch circuit may be modified so that both programming control signals PGMA and PGMB assume a high level when both control signals CTL1 and CTL2 assume a high level in the timing charts of FIGS. 3A to 3C and FIG. 4. More specifically, the modification may be such that both programming control signals PGMA and PGMB assume a high level prior to T1 and after T3 in FIG. 3A, prior to T4 and between T6 and T7 in FIGS. 3B and 3C, and prior to T4 and between T6 and T7 in FIG. 4. In this modification, neither of the first and second power sources VDD1 and VDD2 is selected to cut the current path, whereby the power dissipation in the data latch circuit can be reduced during the high level of both control signals CTL1 and CTL2.

Figure 5:
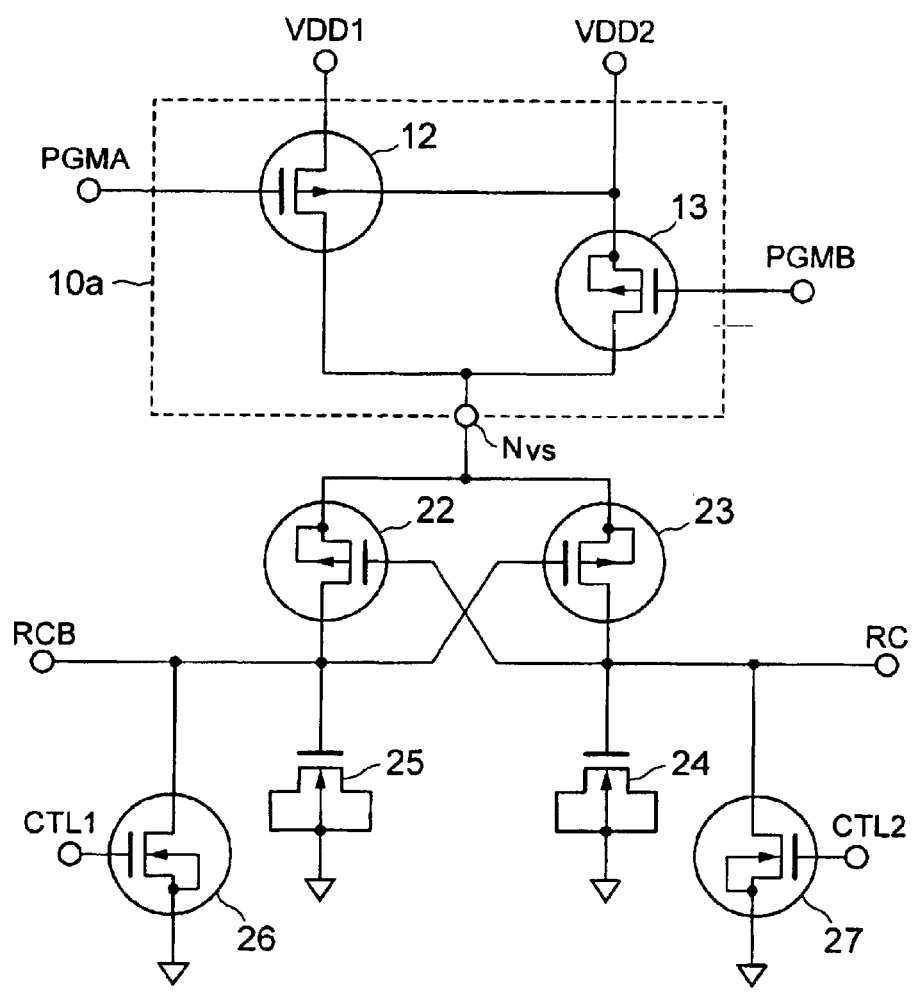
FIG. 5 is a circuit diagram of a data latch circuit according to a third embodiment of the present invention.

Referring to FIG. 5, a data latch circuit according to a third embodiment of the present invention is similar to the data latch circuit of FIG. 1 except for the configuration of the voltage selection block.

More specifically, the voltage selection block 10a shown in FIG. 5 includes a pair of pMOSFETs 12 and 13. The pMOSFET 12 includes a gate insulation film having the second thickness, a source connected to the first power source VDD1, a gate receiving programming control signal PGMA, a drain connected to voltage selection node Nvs and a backgate connected to the second power source VDD2. The pMOSFET 13 includes a gate insulation film having the second thickness, source and backgate connected together to the second power source VDD2, a gate receiving programming control signal PGMB, and a drain connected to voltage selection node Nvs.

In the voltage selection block 10a, if the voltage of the second power source VDD2 becomes lower than the voltage of the first power source VDD1 due to an accidental cause such as noise so that the p-n junction formed between the source (105 in FIG. 2) of pMOSFET 12 and the corresponding n-well (13 in FIG. 2) is forward-biased, an undesirable current path may be formed from the first power source VDD1 to the n-well of pMOSFET 12. In the first embodiment, such a current path is cut by provision of pMOSFET 11. In the second embodiment, the voltage of the second power source VDD2 is accurately controlled equivalently to the control of the voltage of the first power source VDD1, and accordingly, pMOSFET 11 is omitted to thereby reduce the number of high-withstand-voltage MOSFETs.

The voltage selection block 10a delivers the normal operating voltage Vop through voltage selection node Nvs when programming control signals PGMA and PGMB assume a low level and a high level, respectively, and delivers the programming voltage Vpp through voltage selection node Nvs when programming control signals PGMA and PGMB assume a high level and a low level, respectively, similarly to the voltage selection block 10 shown in FIG. 1.

The operation of the data latch circuit shown in FIG. 5 is similar to that described with reference to FIGS. 3A to 3C in connection with the test mode, programming mode and normal operation mode, and thus the details of the operation will not be iterated here. The voltage of the second power source VDD2 may be changed between I/O-circuit voltage Vio and the programming voltage Vpp, as in the case of the first embodiment.

In addition, the modification as described with reference to the first embodiment may be also employed in the second embodiment.

Figure 6:
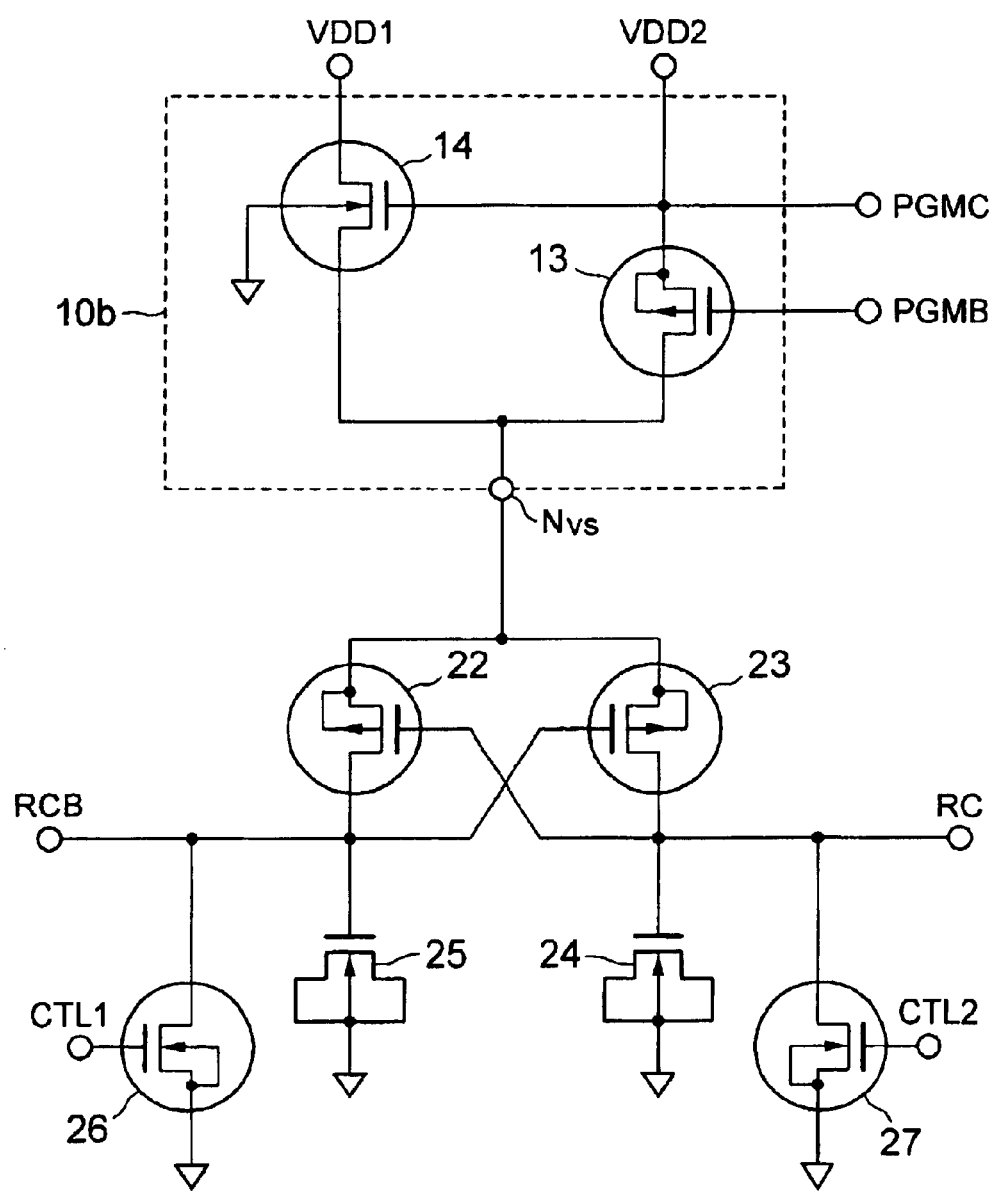
FIG. 6 is a circuit diagram of a data latch circuit according to a fourth embodiment of the present invention.

Referring to FIG. 6, a data latch circuit according to a third embodiment of the present invention is similar to the first embodiment except for the configuration of the voltage selection block.

The voltage selection block 10b shown in FIG. 6 includes nMOSFET 14 and pMOSFET 13. The pMOSFET 13 includes a gate insulation film (silicon oxide film) having the second thickness, source and backgate connected to the second power source VDD2, a gate receiving programming control signal PGMB, and a drain connected to voltage selection node Nvs. The nMOSFET 14 includes a gate insulation film (silicon oxide film) having the second thickness, a drain connected to the first power source VDD1, a gate receiving programming control signal PGMC having a signal level equal to the signal level of programming control signal PGMB, a source connected to voltage selection node Nvs and a backgate connected to the ground.

So long as the second power source VDD2 has a voltage higher than the voltage of the first power source VDD1 plus the threshold voltage of nMOSFET 14, the voltage selection block 10b delivers the normal operating voltage Vop of the first power source VDD1 through voltage selection node Nvs due to turn-ON of nMOSFET 14 when programming control signals PGMB and PGMC assume a high level. When programming control signals PGMB and PGMC assume a low level, the voltage selection block 10b delivers the voltage of the second power source VDD2 due to turn-ON of pMOSFET 13.

The operation of the data latch circuit of the third embodiment is similar to that of the first embodiment described with reference to FIGS. 3A to 3C, and details of the operation will not be iterated here. The voltage of the second power source VDD2 may be changed between I/O-circuit voltage Vio and the programming voltage Vpp, as in the case of the first embodiment. In addition, the modification as described with reference to the first embodiment may also be employed in the third embodiment.

Figure 7:
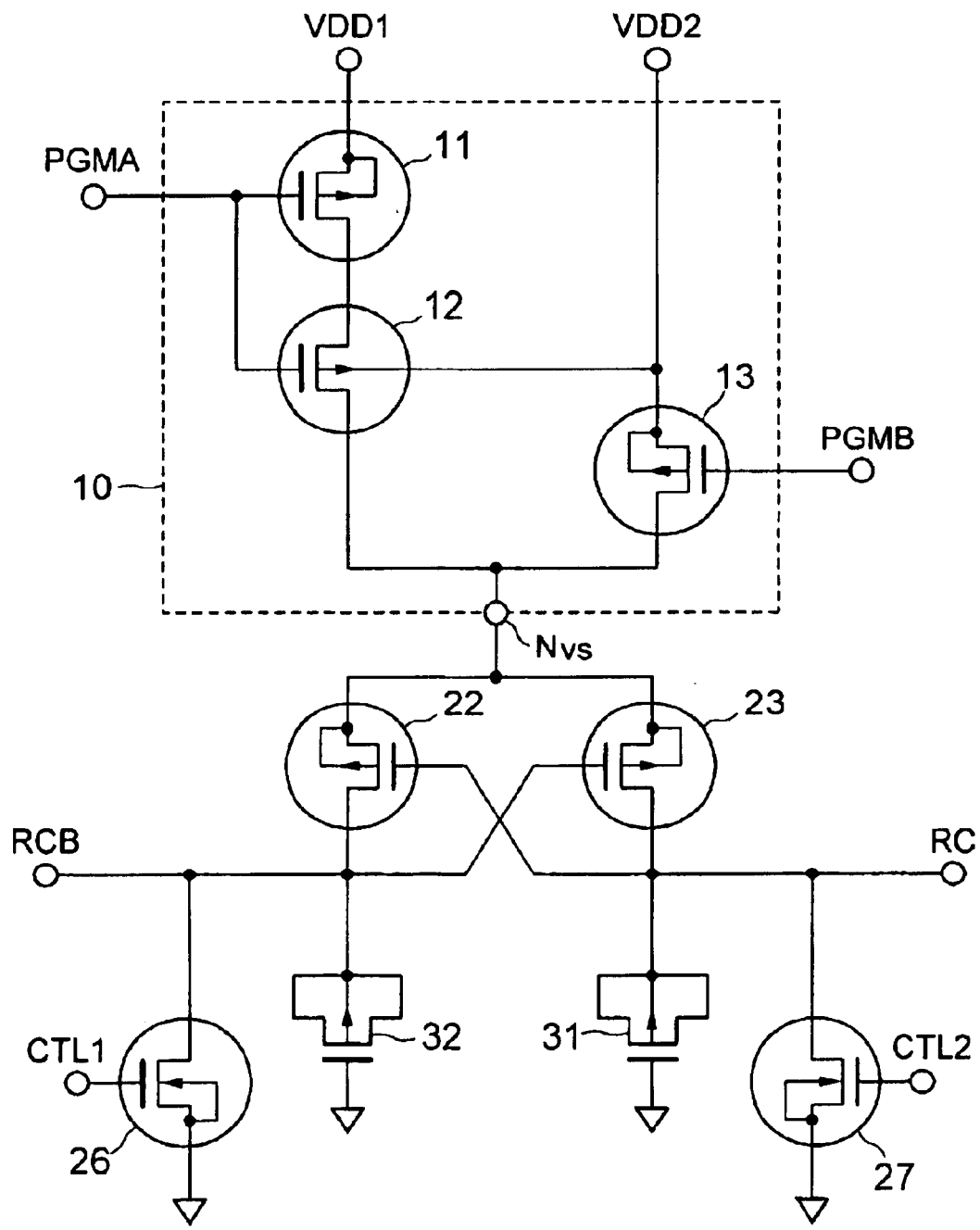
FIG. 7 is a circuit diagram of a data latch circuit according to a fifth embodiment of the present invention.

Referring to FIG. 7, a data latch circuit according to a fifth embodiment of the present invention is similar to the data latch circuit of the first embodiment except for the configuration of the anti-fuse elements. The anti-fuse elements in the present embodiment are implemented by pMOSFETs 31 and 32. The pMOSFET 31 includes source, drain and backgate connected together to output terminal RC, a gate connected to the ground, and a gate insulation film having the first thickness. The pMOSFET 32 includes source, drain and backgate connected together to output terminal RCB, a gate connected to the ground, and a gate insulation film having the first thickness. The operation of the data latch circuit of the present embodiment is similar to that of the first embodiment.

The gates of pMOSFETs 31 and 32 may be connected to a third power source having a negative potential instead of the ground. This configuration can reduce the programming voltage by a voltage corresponding to the negative potential.

In the present embodiment, the voltage of the second power source VDD2 may be changed between I/O-circuit voltage Vio and the programming voltage Vpp. Alternatively, the gate potential of pMOSFETs 31 and 32 may be changed from the ground potential to a negative potential of (Vio-Vpp), with the voltage of the second power source VDD2 being constant at Vio.

Figure 8A:
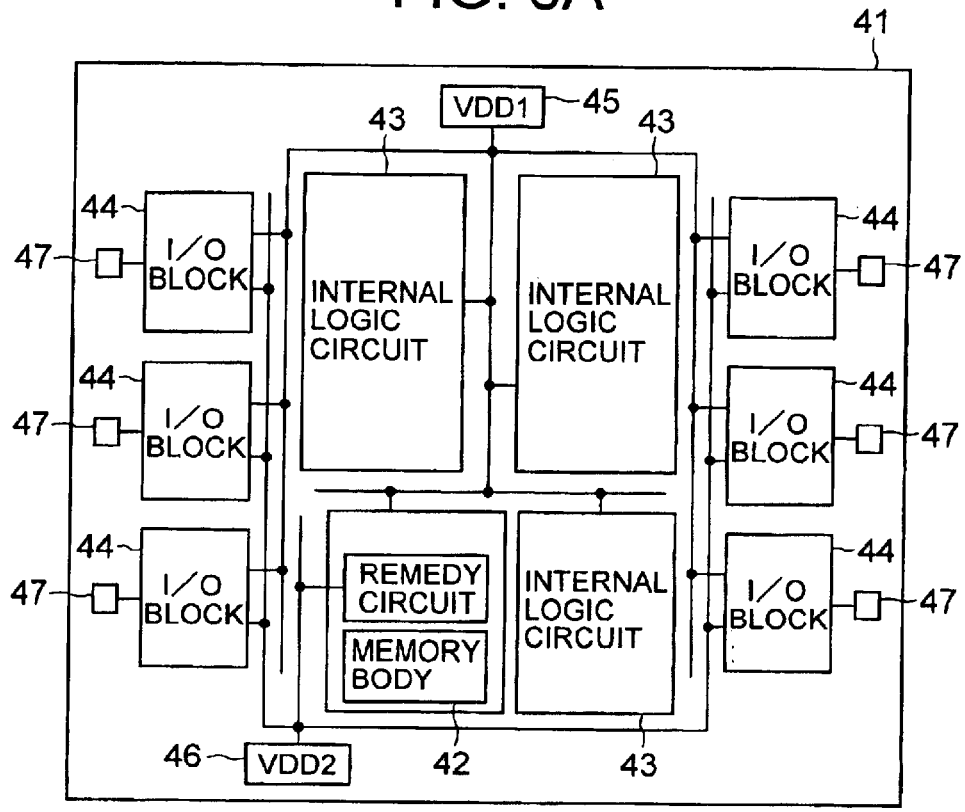
FIG. 8A is a schematic top plan view of a semiconductor device including a data latch circuit according to a sixth embodiment of the present invention.

Referring to FIG. 8A, there is shown a semiconductor chip implementing a semiconductor integrated circuit including a remedy circuit 49 in a memory macro block 42, the remedy circuit 49 including a plurality of data latch circuits according to a sixth embodiment.

The semiconductor chip 41 mounts thereon the memory macro block 42, a plurality of internal logic macro blocks 43, I/O circuit blocks 44, power I/O pad 45 for the first power source VDD1, power I/O pad 46 for the second power source VDD2, and signal I/O pads 47. The I/O circuit block 44 receives both the voltages of the first and second power sources VDD1 and VDD2 from power I/O pads 45 and 46, respectively, whereas the logic macro block 43 receives the normal operating voltage Vop of the first power source VDD1 from the power I/O pad 45. The signals input through the signal I/O pads 47 are delivered to the logic macro blocks 43 after voltage conversion in the I/O circuit blocks 44 to the normal operating voltage Vop. The signals delivered from the logic macro block 43 is output through the I/O pads 44 after voltage conversion into the I/O-circuit voltage Vio of the second power source VDD2.

Figure 8B:
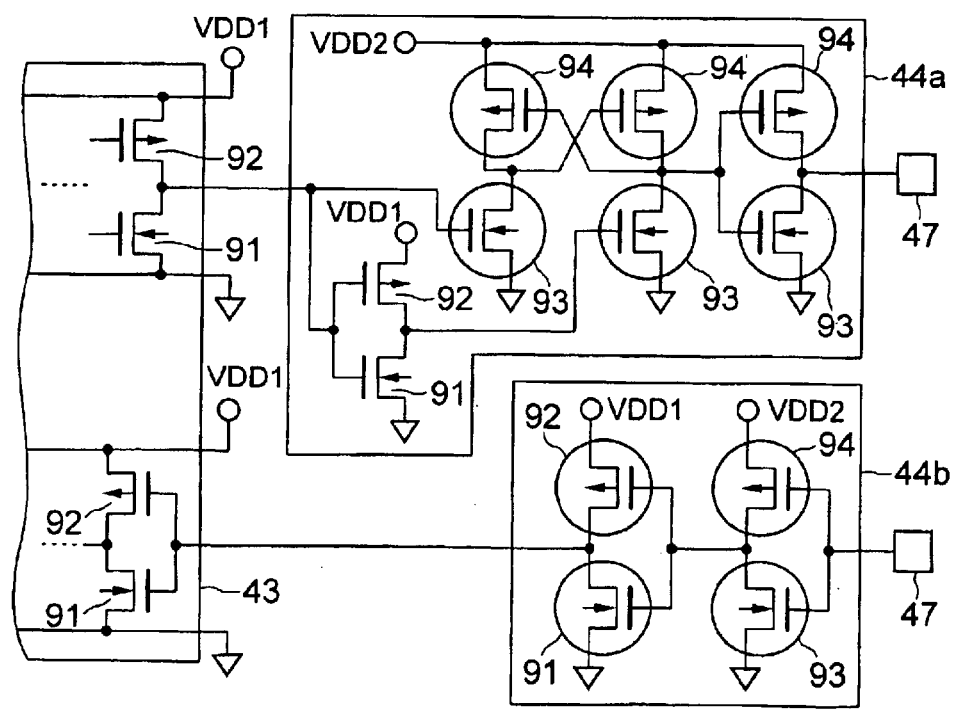
FIG. 8B is a circuit diagram of the interface between the internal logic circuit and the I/O block shown in FIG. 8A.

Referring to FIG. 8B, there are shown configurations of part of the logic macro block 43 and I/O circuit blocks 44a and 44b, wherein I/O circuit block 44a implements an output circuit block and I/O circuit block 44b implements an input circuit block. The logic macro block 43 has a plurality of CMOSFETs each including pMOSFET 91 and nMOSFET 92, both having a gate insulation film of the first thickness equal to the thickness of the gate insulation film of the anti-fuse MOSFETs.

Each of the I/O circuit blocks 44a and 44b includes a plurality of cascaded buffers, at least the outermost I/O buffer of which includes a high-withstand-voltage nMOSFET 93 having a gate insulation film of the second thickness and a high-withstand-voltage pMOSFET 94 having a gate insulation film of the second thickness. The second thickness is equal to the thickness of the gate insulation films of the high-withstand-voltage MOSFETs in the data latch circuit shown in FIG. 1, for example.

The memory macro block 42 includes a memory body 48, which includes a plurality of memory cell arrays (or memory mats) each associated with an address decoder section and a read/write section, and the remedy circuit block 49 for remedying the memory body 48 by replacing defective memory cells in the memory body 48 by redundant memory cells.

The redundant memory cells may be provided in redundant cell rows each for replacing a memory cell row including one or more of defective memory cell, in redundant cell columns each for replacing a memory cell column including one or more of defective memory cell, or in redundant cell rows and redundant cell columns each for replacing a defective memory cell row or defective memory cell column including one or more of defective memory cell.

In the description to follow, the technique of the present invention will be exemplarily described with reference to the shift connection technique applied to a SRAM and described in JP-A-2001-23390. The SRAM using the shift connection technique includes a redundant memory mat affixed to a plurality of ordinary memory mats, wherein each of the I/O terminals is shifted for connection by one mat toward the redundant memory mat for the defective ordinary memory mat and subsequent memory mats. The data latch circuit stores therein remedy information, i.e., information of the shift connection between I/O terminals and the memory mats.

Figure 9:
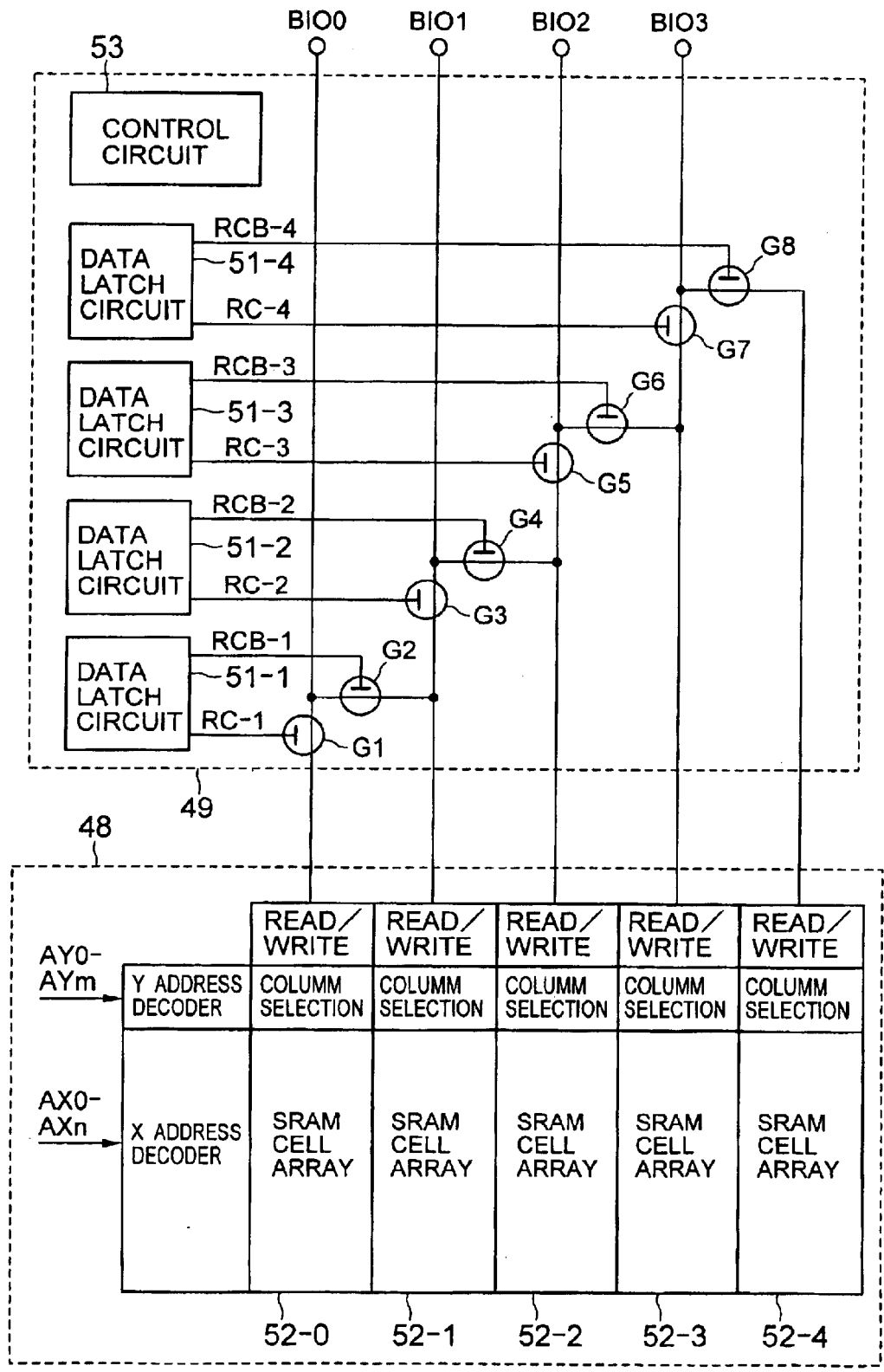
FIG. 9 is a circuit diagram of the memory macro block shown in FIG. 8A.

Referring to FIG. 9, there is shown part of the memory macro block 42, which includes a SRAM memory body 48 and a remedy block 49 for remedying the SRAM macro body 48. The SRAM memory body 48 includes a plurality of ordinary memory mats 52 (52-0 to 52-3) and a redundant memory mat 52-4, X-address decoder, and Y-address decoder. Each of the memory mats 52-0 to 52-4 includes a memory cell array, column selection block and a read/write section. A memory cell is selected from one of memory mats 52-0 to 52-3 and redundant memory mat 52-4 based on the X-address AX0 to AXn and Y-address AY0 to AYm.

The remedy block 49 includes a plurality of data latch circuits 51 (51-1 to 51-4) each disposed for a corresponding one of the I/O terminals B100 to B103, a plurality of transfer gates G1 to G8 for connecting the memory mats 52-0 to 52-3 to respective I/O terminals B100 to B103 and connecting adjacent two of output terminals B100 to B103, and a control circuit 53 for controlling the remedy information to be stored in the data latch circuits 51-1 to 51-4.

Transfer gate G1, G3, G5 or G7 is interposed between each ordinary memory mat 52-0, 52-1, 52-2 or 52-3 and a corresponding I/O terminal 100, B101, B102 or B103, and turns ON and OFF upon a high level and low level, respectively, of output terminal RC-1, RC-2, RC-3 or RC-4 of a corresponding data latch circuit 51-1, 51-2, 51-3 or 51-4. Transfer gate G2, G4, G6 or G8 is interposed between each I/O terminal B100, B101, B102 or B103 and an output line of a memory mat 52-1, 52-2, 52-3 or 52-4 next to a corresponding memory mat 52-0, 52-1, 52-2 or 52-3, and turns ON and OFF upon a high level and a low level, respectively, of output terminal RCB of a corresponding data latch circuit 51-1, 51-2, 51-3 or 51-4.

If all the SRAM cells in the ordinary memory mats 52-0 to 52-3 are normal cells without a defect, the anti-fuse cells in the data latch circuits 51-1 to 51-4 are programmed with a logic level "1" and store therein the logic level "1" as nonvolatile data. Thus, in the normal operation mode of the memory macro block, output terminals RC-1 to RC-4 assume a high level, whereby transfer gates G1, G3, G5 and G7 turn ON to connect the ordinary memory mats 52-0 to 52-3 to respective I/O terminals B100 to B103

On the other hand, if one of the ordinary memory mats 52-0 to 52-3, e.g., memory mat 52-1 includes at least one defective SRAM cell, the remedy information programs the data latch circuits 51-1 to 51-4 with logic levels "1", "0", "0" and "0", respectively. This programming data provides a shift connection in the normal operation mode, which connects the memory mats 52-0 and 52-2 to 52-4 to I/O terminals B100, B101, B102 and B103, respectively, by skipping the defective memory mat 52-1 and incorporating the redundant memory mat 52-4.

Figure 10:
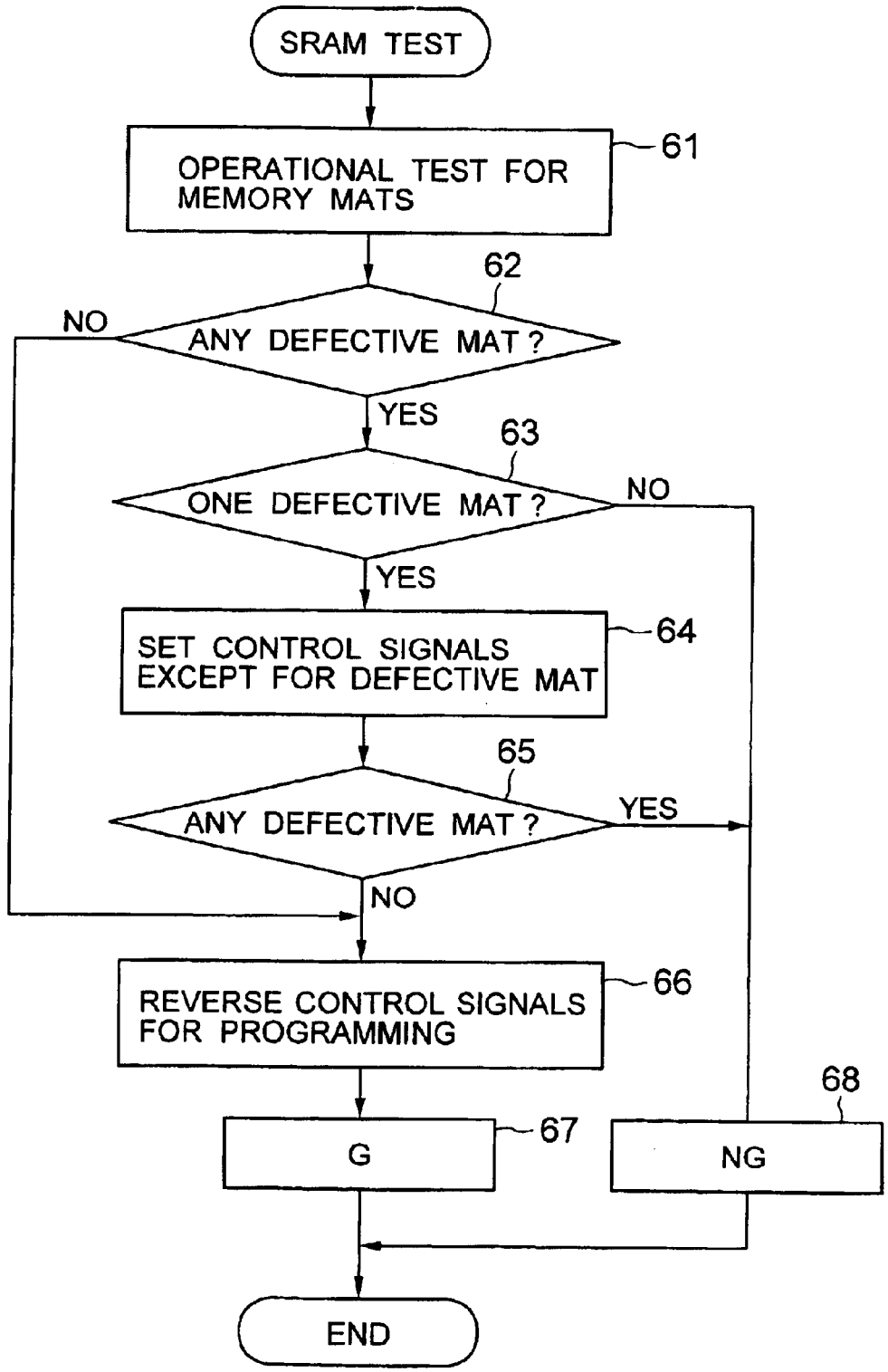
FIG. 10 is a flowchart showing the procedure for testing the memory macro block shown in FIG. 9 and replacing defective memory mat by redundant memory mat in the memory macro block.

Referring to FIG. 10, there is shown a flowchart of the procedure for testing the memory mats and replacing the defective memory mat by redundant memory mat in the memory macro block 42 shown in FIG. 8A.

Before the procedure of FIG. 10, it is examined whether or not the anti-fuse MOSFETs in the data latch circuits 51-1 to 51-4 have a sufficient insulating property for allowing suitable programming operation therefor.

In step 61, memory cells in the memory mats 52-0 to 52-3 are subjected to operational test thereof, while using an ordinary connection by turning ON transfer gates G1, G3, G5 and G7. For raising the potential of output terminals RC-1 to RC-4 of the data latch circuits 51-1 to 51-4 to a high level, it is sufficient to allow control signals CTL1 and CTL2 to assume a high level and a low level, respectively, in each of the data latch circuits 51-1 to 51-4.

In next step 62, it is judged whether or not there is a defective memory mat found in the test of step 61. If each of the memory mats 52-0 to 52-3 has no defect therein, the process advances to step 66. On the other hand, if it is judged in step 62 that there is a defective memory mat found in the test of step 61, the process advances to step 63.

In step 63, it is judged whether the number of defective memory mats is one or above. If the number of defective memory mats is two or above, the process advances to step 68, wherein it is judged that the memory macro block has an un-recoverable defect and the procedure is finished. On the other hand, if the number of defective memory mats is only one, the process advances to step 64.

In step 64, control signals CTL1 and CTL2 are ordinarily set for the data latch circuits except for the specific data latch circuits corresponding to the defective memory mat and the subsequent memory mats, to perform the operational test for the memory body 48. More specifically, since memory mat 52-1 has a defect therein, control signals CTL1 and CTL2 shown in FIG. 1 are set at a high level and a low level, respectively, in data latch circuit 51-1 to raise the potential of output terminal RC-1 to a high level. On the other hand, control signals CTL1 and CTL2 are set at a low level and a high level, respectively, in data latch circuits 51-2 to 51-4 corresponding to the defective memory mat and the subsequent memory mats, to raise the potential of output terminal RCB-2 to RCB-4 to a high level.

Thus, transfer gates G1, G4, G6 and G8 are turned ON, with other transfer gates G2, G3, G5 and G7 being turned OFF, whereby memory mat 52-0 is coupled to a corresponding I/O terminal B100, whereas memory mats 52-2 to 52-4 are coupled to I/O terminals B101 to B103, respectively, by a shift connection. In this state, memory mats 52-0, and 52-2 to 52-4 are examined for the operation in step 65.

Then, the process advances to step 65, wherein it is judged whether or not there is a defective mat. If it is judged in step 65 that there is no defective mat, the process advances to step 66, whereas if it is judged in step 65 that there is another defective mat, the process advances to step 68 wherein the memory macro block has an un-recoverable defect (NG) therein and the procedure is finished.

In step 66, the levels of control signals CTL1 and CTL2 are reversed to allow the data latch circuits 51-1 to 51-4 to enter a programming mode. For example, if it is judged in step 62 that there is no defect in memory mats 52-0 to 52-3, control signals CTL1 and CTL2 are reversed to assume a low level and a high level, respectively, followed by programming the anti-fuse MOSFETs in step 66. Thus, data latch circuits are programmed with a logic level "1", which allows transfer gates G1, G3, G5 and G7 to turn ON after entering the normal operation mode.

On the other hand, if memory mat 52-1 is a defective mat with other mats 52-0, 52-2 to 52-4 being non-defective mats, and thus it is judged in step 65 that there is no defective mat, then control signals CTL1 and CTL2 are reversed to a low level and a high level, respectively, in data latch circuit 51-1 whereas control signals CTL1 and CTL2 are reversed to a high level and a low level, respectively, in data latch circuits 51-2 to 51-4, in step 66, for performing the programming. This allows data latch circuit 51-1 to be programmed with a logic level "1" and data latch circuits 51-2 to 51-4 with a logic level "0". After the data latch circuits 51-1 to 51-4 enter a normal operation mode, transfer gates G1, G4, G6 and G8 turn ON whereby I/O terminals B100 to B103 are connected to respective non-defective mats 52-0 and 52-2 to 52-4 by a shift connection scheme while skipping the defective memory mat 51-1 and incorporating redundant memory mat 52-4. Thus, the defect in the memory body 48 in the memory macro block 42 can be remedied.

In next step 67, the memory macro block is judged as a non-defective memory block (G) to finish the procedure.

It is to be noted that the second power source VDD2 in FIG. 8A may have I/O-circuit voltage Vio during testing the memory mats, then have the programming voltage Vpp having a higher voltage in the programming mode, as shown in FIG. 4, and have the I/O-circuit voltage Vio in the normal operation mode after exiting the programming mode.

In an alternative, if the I/O-circuit voltage Vio supplied from the second power source VDD2 in the normal operation mode is sufficient for programming the anti-fuse MOSFETs in the data latch circuits, the programming voltage Vpp of the second power source VDD2 may be set equal to the I/O-circuit voltage Vio.

In the above embodiment, the present invention is exemplarily applied to the SRAM macro block which is remedied by using a shift connection scheme; however, the present invention is not limited to the semiconductor device having such a shift-connection remedy scheme. That is, the present invention can be applied to any type of memory devices, such as a cell replacement scheme wherein each defective memory cell is replaced by a corresponding redundant memory cell, a row replacement scheme wherein a defective memory cell row is replaced by a redundant cell row, a column replacement scheme wherein a defective memory cell column is replaced by a redundant cell column, or a combination replacement scheme wherein either a memory cell row or memory cell column is replaced by a redundant cell row or redundant cell column by selection. The present invention is also applied to any volatile semiconductor memory device such as a DRAM.

As described above, in the above embodiments, it is unnecessary to provide a dedicated fabrication process for the anti-fuse elements because the anti-fuse elements are implemented by MOSFETs. In addition, the number of transistor elements needed to implement a data latch circuit can be reduced, and thus the occupied area for the nonvolatile latch circuit can be reduced. MOSFETs including gate insulation films having a larger thickness can be formed in the procedure for fabricating high-withstand-voltage MOS-FETs such as used for the outermost I/O buffers of the I/O blocks, i.e., the last-stage buffer in an output circuit block and a first-stage buffer in an input circuit block.

Since the above embodiments are described only for examples, the present invention is not limited to the above embodiments and various modifications or alterations can be easily made therefrom by those skilled in the art without departing from the scope of the present invention.

What is claimed is:

1. A data latch circuit comprising:
   a voltage selection block for selecting one of a normal operating voltage supplied from a first power source and a programming voltage supplied from a second power source, to output a selected voltage through a voltage selection node;
   a first first-conductivity-type MOSFET including a source and a backgate connected together to said voltage selection node, a gate directly connected to a first output terminal, and a drain connected to a second output terminal;
   a second first-conductivity-type MOSFET including a source and a backgate connected together to said voltage selection node, a gate directly connected to said second output terminal, and a drain connected to said first output terminal;
   a first anti-fuse element including a first electrode connected to said first output terminal, a second electrode connected to a third power source, and an insulating film sandwiched between said first electrode and said second electrode and having a first withstand voltage lower than said programming voltage;
   a second anti-fuse element including a first electrode connected to said second output terminal, a second electrode connected to said third power source, and an insulating film sandwiched between said first electrode and said second electrode and having said first withstand voltage;
   a first second-conductivity-type MOSFET including a drain connected to said second output terminal, a gate for receiving a first control signal, and a source and a backgate connected together to said third power source;
   a second second-conductivity-type MOSFET including a drain connected to said first output terminal, a gate receiving a second control signal, and a source and backgate connected to said third power source, wherein:
   each of said first and second first-conductivity-type MOSFETs and said first and second second-conductivity-type MOSFETs includes a gate insulation film having a second withstand voltage higher than said programming voltage.

2. The data latch circuit according to claim 1, wherein said voltage selection block comprises:
   a third first-conductivity-type MOSFET including a source and a backgate connected together to said first power source, a gate receiving a first programming control signal which assumes an inactivating level therefor during a programming mode, and a gate insulation film having said second withstand voltage;
   a fourth first-conductivity-type MOSFET including a source connected to said drain of said third first-conductivity-type MOSFET, a gate receiving said first programming control signal, a drain connected to said voltage selection node, a backgate connected to said second power source, and a gate insulation film having said second withstand voltage;

a fifth first-conductivity-type MOSFET including a source and a backgate connected together to said second power source, a gate receiving a second programming control signal which assumes an activating level therefor during said programming mode, a drain connected to said voltage selection node, and a gate insulation film having said second withstand voltage.

3. The data latch circuit according to claim 1, wherein said voltage selection block comprises;

a third first-conductivity-type MOSFET including a source connected to said first power source, a gate receiving a first programming control signal which assumes an inactivating level therefor during a programming mode, a drain connected to said voltage selection node, a backgate connected to said second power source, and a gate insulation film having said second withstand voltage; and a fourth first-conductivity-type MOSFET including a source and backgate connected to said second power source, a gate receiving a second programming signal which assumes an activating level therefor during said programming mode, a drain connected to said voltage selection node, and a gate insulation film having said second withstand voltage.

4. The data latch circuit according to claim 1, wherein said voltage selection block comprises:

third second-conductivity-type MOSFET including a drain connected to said first power source, a gate receiving a first programming signal which assumes an inactivating level therefor during a programming mode, a source connected to said voltage selection node, a backgate connected to said third power source, and a gate insulation film having said second withstand voltage; and a third first-conductivity-type MOSFET including a source and a backgate connected together to said second power source, a gate receiving a second programming signal which assumes an activating level therefor during said programming mode, a drain connected to said voltage selection node, and a gate insulation film having said second withstand voltage.

5. The data latch circuit according to claim 1, wherein each of said first and second anti-fuse elements is a capacitive element.

6. The data latch circuit according to claim 5, wherein said capacitive element is a MOSFET including a gate insulation film having said first withstand voltage.

7. The data latch circuit according to claim 6, wherein said MOSFET includes a gate connected to said voltage selection node, and a source, a drain and a backgate connected together to said third power source.

8. The data latch circuit according to claim 6, wherein said gate of said MOSFET is connected to said third power source, and source, drain and backgate of said MOSFET is connected together to said voltage selection node.

9. The data latch circuit according to claim 6, wherein said gate insulation film of each of said capacitive elements is made of a material same as a material of said gate insulation films of said first- and second-conductivity-type MOSFETs.

10. The data latch circuit according to claim 6, wherein each of said capacitive elements is an n-channel MOSFET.

11. The data latch circuit according to claim 6, wherein each of said capacitive elements is a p-channel MOSFET.

12. The data latch circuit according to claim 1, wherein each of said first-conductivity-type MOSFETs is a p-channel MOSFET, and each of said second-conductivity-type MOSFETs is an n-channel MOSFET.

13. The data latch circuit according to claim 1, wherein said second power source supplies another voltage during a normal operation mode of said latch circuit, said another voltage is higher than said normal operating voltage and lower than said programming voltage.

14. A semiconductor device comprising:

an internal logic circuit operating at a first voltage supplied from a first power source, said internal logic circuit including internal MOSFETs each having a gate insulation film having a first withstand voltage;

an I/O circuit block operating at a second voltage higher than said first voltage, said second voltage is supplied from a second power source, and including I/O MOSFETs for inputting/outputting a signal for said internal logic circuit, at least one of said I/O MOSFETs including a gate insulation film having a second withstand voltage higher than said first withstand voltage; and a memory macro block including a remedy circuit, a plurality of ordinary memory mats and at least one redundant memory mat, each of said ordinary memory mats and said redundant memory mat including a memory cell array, a column selection section and a read/write section, said remedy circuit including a plurality of data latch circuits each for storing remedy information and having functions of inactivating said read/write section of a corresponding one of said ordinary memory mats and activating said read/write section of said redundant memory mat, each of said data latch circuits comprising:

a voltage selection block for selecting one of said first voltage and said second voltage to output a selected voltage through a voltage selection node;

a first first-conductivity-type MOSFET including a source and a backgate connected together to said voltage selection node, a gate directly connected to a first output terminal, and a drain connected to a second output terminal;

a second first-conductivity-type MOSFET including a source and a backgate connected together to said voltage selection node, a gate directly connected to said second output terminal, and a drain connected to said first output terminal;

a first anti-fuse element including a first electrode connected to said first output terminal, a second electrode connected to a third power source, and an insulating film sandwiched between said first electrode and said second electrode and having the first withstand voltage lower than said second voltage;

a second anti-fuse element including a first electrode connected to said second output terminal, a second electrode connected to said third power source, and an insulating film sandwiched between said first electrode and said second electrode and having said first withstand voltage;

a first second-conductivity-type MOSFET including a drain connected to said second output terminal, a gate receiving a first control signal, and a source and a backgate connected together to said third power source;

a second second-conductivity-type MOSFET including a drain connected to said first output terminal, a gate receiving a second control signal, and a source and backgate connected to said third power source, wherein:

each of said first and second first-conductivity-type MOSFETs and said first and second second-conductivity-type MOSFETs includes a gate insulation film having the second withstand voltage higher than said second voltage.

15. The semiconductor device according to claim 14, wherein each of said first and second anti-fuse elements is a capacitive element.

16. The semiconductor device according to claim 15, wherein said capacitive element is a MOSFET including a gate insulation film having said first withstand voltage.

17. The semiconductor device according to claim 16, wherein said MOSFET includes a gate connected to said voltage selection node, and a source, a drain and a backgate connected together to said third power source.

18. The semiconductor device according to claim 16, wherein said gate of said MOSFET is connected to said third power source, and source, drain and backgate of said MOSFET is connected together to said voltage selection node.

19. The semiconductor device according to claim 16, wherein said gate insulation film of each of said capacitive elements is made of a material same as a material of said gate insulation films of said first- and second-conductivity-type MOSFETs.

20. The semiconductor device according to claim 16, wherein each of said capacitive elements is an n-channel MOSFET.

21. The semiconductor device according to claim 16, wherein each of said capacitive elements is a p-channel MOSFET.

22. The semiconductor device according to claim 14, wherein each of said first-conductivity-type MOSFETs is a p-channel MOSFET, and each of said second-conductivity-type MOSFETs is an n-channel MOSFET.

23. The semiconductor device according to claim 14, wherein said second power source supplies another voltage during a normal operation mode of, said another voltage is higher than said first voltage and lower than said second voltage.

24. The semiconductor device according to claim 14, wherein each of said I/O MOSFETs is an outermost I/O MOSFET connected to an external pad of said semiconductor device.

* * * * *